United States Patent [19]
Silveira et al.

[11] Patent Number: 5,863,374
[45] Date of Patent: *Jan. 26, 1999

[54] METHOD AND APPARATUS FOR PEELING A LAMINATE

[76] Inventors: Frank S. Silveira, 9 Hathaway Rd., Wilmington, Mass. 01887; John B. Morse, 9 Durham St., Boston, Mass. 02115; Dana F. Schuh, 10 Ballard Rd., Derry, N.H. 03038

[ * ] Notice: The term of this patent shall not extend beyond the expiration date of Pat. No. 5,658,416.

[21] Appl. No.: 410,146

[22] Filed: Mar. 24, 1995

[51] Int. Cl.$^6$ ....................................................... B32B 35/00
[52] U.S. Cl. .......................... 156/344; 156/584; 271/281; 271/282; 430/256
[58] Field of Search ..................................... 156/344, 584; 271/280, 281, 285, 282; 430/256, 257, 258, 259, 260, 261; 354/354; 396/661

[56] References Cited

U.S. PATENT DOCUMENTS

| | | | |
|---|---|---|---|
| 3,266,406 | 8/1966 | Stievenart | 271/285 X |
| 3,542,361 | 11/1970 | Call | 271/64 |
| 3,669,445 | 6/1972 | Wallis | 271/26 |
| 3,820,776 | 6/1974 | Fujimoto et al. | 271/80 |
| 3,984,097 | 10/1976 | Touchette | 271/172 |
| 4,183,751 | 1/1980 | Matsumoto et al. | 156/344 X |
| 4,252,310 | 2/1981 | Kono et al. | 271/308 |
| 4,261,560 | 4/1981 | Yanagawa et al. | 271/308 |
| 4,344,613 | 8/1982 | Isikawa | 271/165 |
| 4,387,981 | 6/1983 | Cormier | 355/3 SH |
| 4,391,038 | 7/1983 | Greene et al. | 29/829 |
| 4,417,800 | 11/1983 | Hirose et al. | 355/3 TR |
| 4,474,368 | 10/1984 | Peter, III et al. | 271/308 |
| 4,690,395 | 9/1987 | Nowicki | 271/98 |
| 4,951,936 | 8/1990 | Taniyama | 271/307 |
| 5,042,792 | 8/1991 | Honegger et al. | 271/188 |
| 5,294,514 | 3/1994 | Lynch et al. | 430/256 X |
| 5,520,776 | 5/1996 | Van Allen et al. | 156/584 |

FOREIGN PATENT DOCUMENTS

2008028  5/1979  United Kingdom ............ B32B 35/00

*Primary Examiner*—Mark A. Osele

[57] ABSTRACT

Method and apparatus for peeling an image media-laminate to remove a throw-away layer from a keeper layer. The laminate is fed through a nip defined by upper and lower rolls and then the laminate is bent upwardly about a surface on the upper roll by an upwardly moving bar. One side of the bent laminate opposite the bar is held by vacuum adjacent a free edge of the laminate and then the bar is lowered during which a spring element on the bar deflects the free edge of the laminate to separate the layers due to differences in their stiffness. The lowering of the bar permits the keeper layer to descend as it separates from the throw-away layer which is released from the vacuum and continuously peeled by take-away rollers.

35 Claims, 14 Drawing Sheets

METHOD AND APPARATUS FOR PEELING A LAMINATE

RELATED APPLICATION

This application is related to U.S. patent application, Ser. No. 08/261,159 now U.S. Pat. No. 5,658,416 filed Jun. 17, 1994 entitled METHOD AND APPARATUS FOR PEELING A LAMINATE and assigned to the Assignee of the present application. The disclosure of the aforementioned application, Ser. No. 08/261,159 now U.S. Pat. No. 5,658,416 is hereby incorporated by reference herein as part hereof.

BACKGROUND OF THE PRESENT INVENTION

The present invention generally relates to methods and apparatus for peeling or delaminating a composite sheet structure or laminate containing image media.

In the graphics arts field, it is extremely important that so-called master images of the original objects being reproduced in a prepress operation be free of visually discernible image defects that would impact negatively in the formation of commercially acceptable prints. The master images are, in turn, used in the subsequent formation of either positive or negative copies, depending on the platemaking process employed. Since the final printed image will only be as good as its master image, considerable efforts are undertaken to produce only the highest quality master.

Some conventional approaches in the graphic arts area, such as letterpress and offset lithography, rely on the use of halftones to reproduce continuous tone original images. Halftone techniques employ very small and defined screen dots of varying sizes and arranged in varying spacing patterns to reproduce continuous tone images. The screen dots are relatively small and range in size. If these screen dots are not produced with the desired definition and with the desired spacing patterns, the resultant continuous tone images will be less than the quality desired and thus, render the prints commercially unacceptable. Therefore, it is extremely important that the halftone screen dots and image patterns be precisely formed and processed in a manner which preserves their desired definition and spacing characteristics.

Conventional halftone approaches in prepress printing rely on silver halide photography and can include a graphics art camera of the darkroom type. Development of the latent images on the light sensitive film is achieved through a series of chemical processing steps which include immersing the film in a special developer that converts the silver halide to metallic silver in proportion to the amount of exposure received. Each film type uses special developing agents and other combinations of chemicals and water for fixing and stabilizing the film during processing. Some film processors use lasers for generating images instead of cameras. It will be appreciated that the entire silver halide process suffers several shortcomings because of the chemical storage, handling and disposal concerns it occasions. Moreover, silver halide film is light sensitive and this presents other handling issues in order to protect it.

A recent development in the image forming arts has achieved high quality, high resolution images, such as radiological images of the medical type, without the need for silver halide film and processing techniques along with their attendant equipment and chemical processing issues. In this regard, high quality and high resolution images have been produced by a dry process imaging process which uses laser beams imaging on a thermographic image forming medium. Examples of this kind of thermographic image forming medium are described in commonly assigned International Patent Application No. PCT/US 87/03249 published Jun. 16, 1988, under International Publication Number WO 88/04237; and U.S. Pat. No. 5,200,297. After this laminate has been imaged, it is delaminated by peeling one layer therefrom and having the remaining imaged media relaminated with a protective coating. For a more detailed description of the imaging technique and an associated peeling process, reference is made to commonly assigned U.S. Pat. No. : 5,141,584 to Schuh et al. However, it has been determined that dry peeling the laminate can produce image defects which render a commercially unacceptable product. The peeling defects and their severity are caused by a variety of factors associated with the peeling action itself, and the physical and/or chemical properties of the media. For instance, some of the image defects or artifacts of the resultant peeled images are attributable to the alternating high and low density areas in the image media. For instance, some of these artifacts occur in the vicinity of areas of exposed and unexposed portions that may be both transverse and linear to the web directions. It is, therefore, highly desirable to produce images which are free of these kinds of defects.

OBJECTS OF THE PRESENT INVENTION

An object of the present invention is to provide novel and improved methods and apparatus for delaminating a composite sheet structure or laminate, preferably, containing imaging media. Although the invention need not be limited thereto, one type of such laminate may include a vertically frangible and thermally image forming layer including a pigment layer, such as carbon and a plurality of layers bonded to opposite sides of the pigment layer by adhesive layers. Included in the aforementioned object is the provision of such methods and apparatus which will serve to reduce defects in the image forming media due to delamination so as to improve the quality of the image that may be produced through use of the laminate.

A further object is to provide novel and improved methods and apparatus for peeling a laminate containing imaging media and which are suitable for commercial production and use in conjunction with existing print engines, such as laser scanning devices of the thermal actuating type.

Another object of the present invention is to provide novel and improved methods and apparatus for separating layers of a laminate at an edge portion of the laminate to facilitate subsequent removal of one layer by peeling or otherwise.

SUMMARY OF PREFERRED METHOD AND APPARATUS OF THE INVENTION

According to a preferred form of the invention, a laminate is transported into a nip defined by a lower peel roll and an upper peel roll having a peel surface. The lower peel roll is then moved toward the upper peel roll so as to engage the laminate behind the leading edge portion of the laminate. The leading edge portion is then bent or folded to one side thereof about the peel surface against a holding mechanism, preferably a vacuum device, which holds the throw-away layer of the laminate. The laminate is bent upwardly about the peel surface by a folding or bending bar mounted for movement between upper and lower positions. The bending bar engages the keeper layer on the side of the laminate opposite the side held by the vacuum device. After the laminate is held by the vacuum device, the bending bar is lowered and as the latter begins, a deflecting element, preferably a resilient flexible element, engages across the free edge of the laminate to deflect the same. Due to the different stiffness' of the layers of the laminate, the layers will separate from each other, and as the bending bar continues its downward movement the keeper layer will also fall away from the throw-away layer and be driven along its path as the separated layer, having been released from the vacuum device, is peeled from the remainder of the laminate as the latter continues to be transported through the nip. The peeling is accomplished for example, by exerting tension forces on the separated throw-away layer, such as for example by means of eject rolls which act in conjunction with the lower peel roll to control the peeling.

In accordance with one preferred apparatus of the invention for performing the aforementioned bending step, a linkage mechanism is used to bring an elongated bending bar into transverse engagement with the leading edge portion of the laminate to bend it about the upper peel surface as described above. A suitable motor drives the linkage mechanism between upper and lower positions. When the bending bar returns to its inoperative position allowing the keeper to return to the travel path, a deflector roll is preferably used to engage the keeper and guide it along its path of travel.

BRIEF DESCRIPTION OF THE DRAWINGS

Other objects and advantages of the present invention will become apparent from the following more detailed description taken in conjunction with the attached drawings in which.

DETAILED DESCRIPTION

Figure 1:
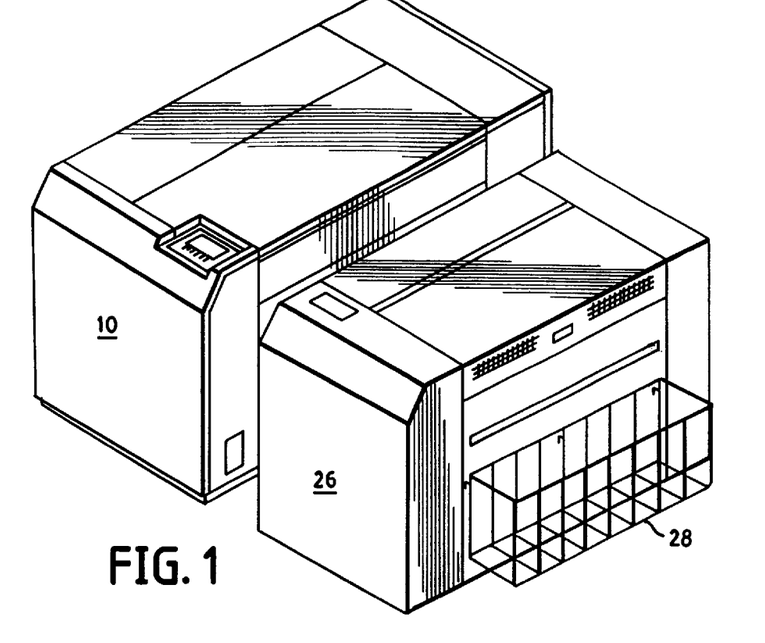
FIG. 1 is a perspective view of associated print engine and peeler-laminator machines, the latter performing and incorporating methods and apparatus of the present invention.
Figure 1A:
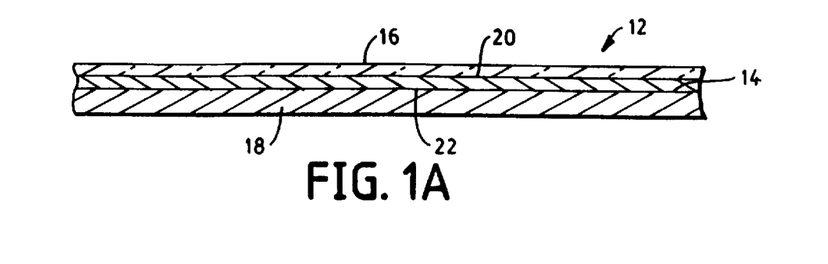
FIG. 1a is a longitudinal cross-sectional view of one type of laminate with which the present invention is concerned.
Figure 2:
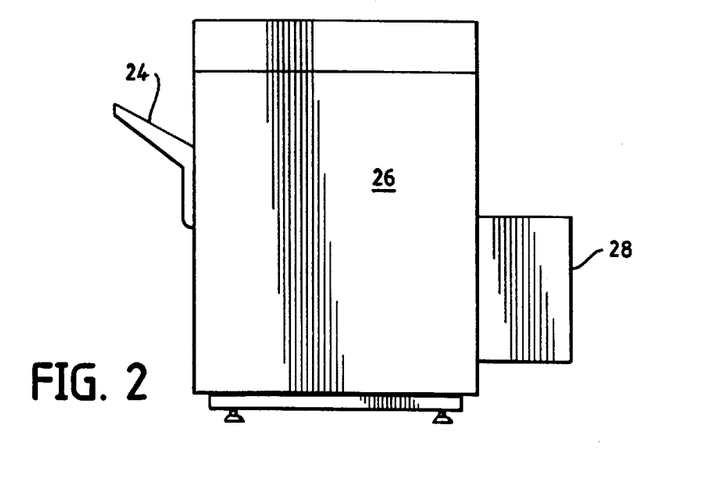
FIG. 2 is an end view of the peeler-laminator machine shown in FIG. 1.

Referring now to the drawings in detail, there is shown in FIG. 1 a print engine or thermal laser imaging device 10 for producing laminates of the type shown for example at 12 in FIG. 1a including image media, that have been produced in the print engine 10 through thermal imaging, such as by a laser or any other suitable device. By way of example, the laminate 12 may include an internal layer 14 comprised of a pigment such as carbon, opposite image-bearing layers 16 and 18 on opposite sides of the pigment layer, and adhesive layers 20 and 22 respectively bonding the image-bearing layers to the pigment layer. As will be described below, the methods and apparatus of the present invention may be utilized to peel or delaminate one of the image-bearing layers. For a further description of laminates with which the present inventions are concerned, reference may be had to commonly assigned U.S. Pat. Nos. 5,159,352 to Ferla et al and 5,141,584 Schuh et. al and International Patent Application No. PCT/US 87/03249 published Jun. 16, 1988 under International Publication No. WO/04237; and U.S. Pat. No. 5,200,297; it being understood that the laminate itself forms no part of the present invention. The disclosures of the aforementioned patents and patent applications are hereby incorporated by reference herein as part hereof. It will be appreciated that the present invention contemplates the peeling of other, preferably image forming laminates such as can be used in the formation of photomasks for printed circuit boards and the like.

After the laminate 12 is imparted with an image by the print engine 10, it is deposited by the latter at an inlet 24 of a peeler-laminator 26 which contains apparatus in accordance with the present invention for performing methods in accordance with the present invention. As will be described in detail below, the peeler-laminator 26 peels one of the layers (the "take-away" or "throw-away" or "strip sheet") of the laminate 12 which layer is discarded. The remainder (the "keeper") of the laminate is then relaminated with another layer over the surface which was exposed by the peeling process. In the illustrated embodiments, the thickness of the take-away and keeper sheets 16 and 18; respectively, can be about 0.013 to 0.178 mm (0.5 to 7 mil) and 0.038 to 0.254 mm (0.5 to 10 mil). Other dimensions may, of course, be substituted. As will be seen below, it has been found to be advantageous to have one of the sheets relatively stiffer, i.e., less flexible than the other. The difference in stiffness may be provided by a difference in materials of which the sheets 16, 18 are made. Preferably, however, and as shown, the different stiffness are attained by one of the sheets, such as throw-away sheet 16 being thinner than the other or keeper sheet 18.

The present invention is concerned with methods and apparatus for peeling the layer prior to the relamination step. However for a description of the relamination method and apparatus, reference may be had to U.S. application, Ser. No. 08/240,854, now U.S. Pat. No. 5,582,669 (M. A. Gove et al.) filed on May 10, 1994, and assigned to the Assignee of the present application. After the laminate is processed by the peeler-laminator 26, it is deposited in an outlet receptacle basket 28 to be later used as a master in the formation of a printing drum or cylinder through an etching process which forms no part of the present invention.

Figure 3:
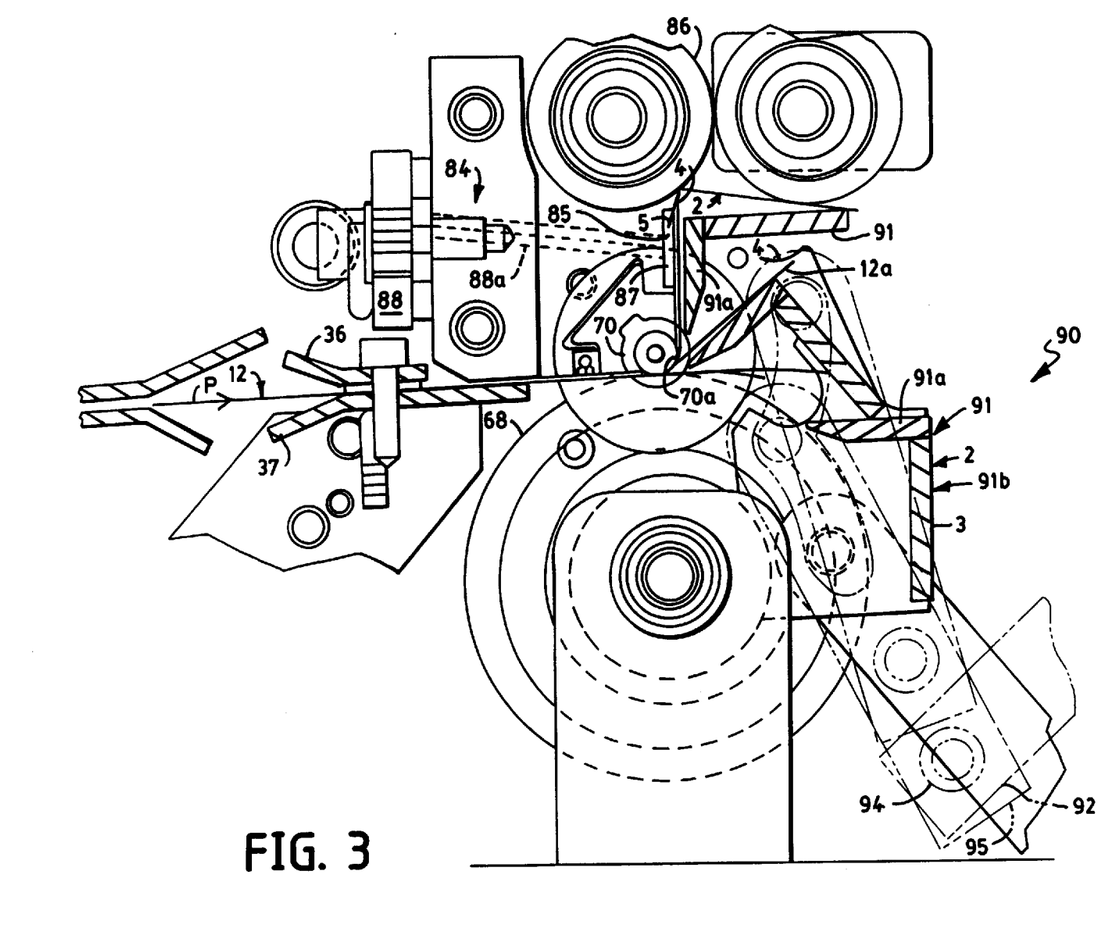
FIG. 3 is a side elevational view with certain parts in cross-section and others removed for clarity, of apparatus constituting one embodiment of the present invention and with certain parts shown in different positions.

Referring to FIG. 3, after the laminate is preliminary deskewed, it is advanced along the path P to a peeling station, the inlet to which is defined by upper and lower flared plates 36 and 37. At this station a nip is defined by a lower peel roll 68 and an upper peel surface 70a formed in the specific embodiment by a small diameter roll 70. Lower peel roll 68 is driven in any suitable manner for purposes of transporting the laminate along the path. Although in the embodiment shown in FIG. 3, the peel surface 70a is provided by the periphery of a roll or cylindrical shaft mounted for rotation about an axis which extends parallel to the axis of the underlying peel roll 68. In other forms the peel surface may have a different shape and be offset from the underlying roll 68. In one preferred embodiment, the lower peel roll 68 may have a covering of high friction material such as silicone. Although in the embodiment shown, the peel 70 is mounted for rotatable movement, in other embodiments (not shown), it may be a stationary member. Although the peel roll 70 in this embodiment is driven frictionally through the lower peel roll, the invention also envisions that the upper peel roll 70 can be positively driven.

Figure 4:
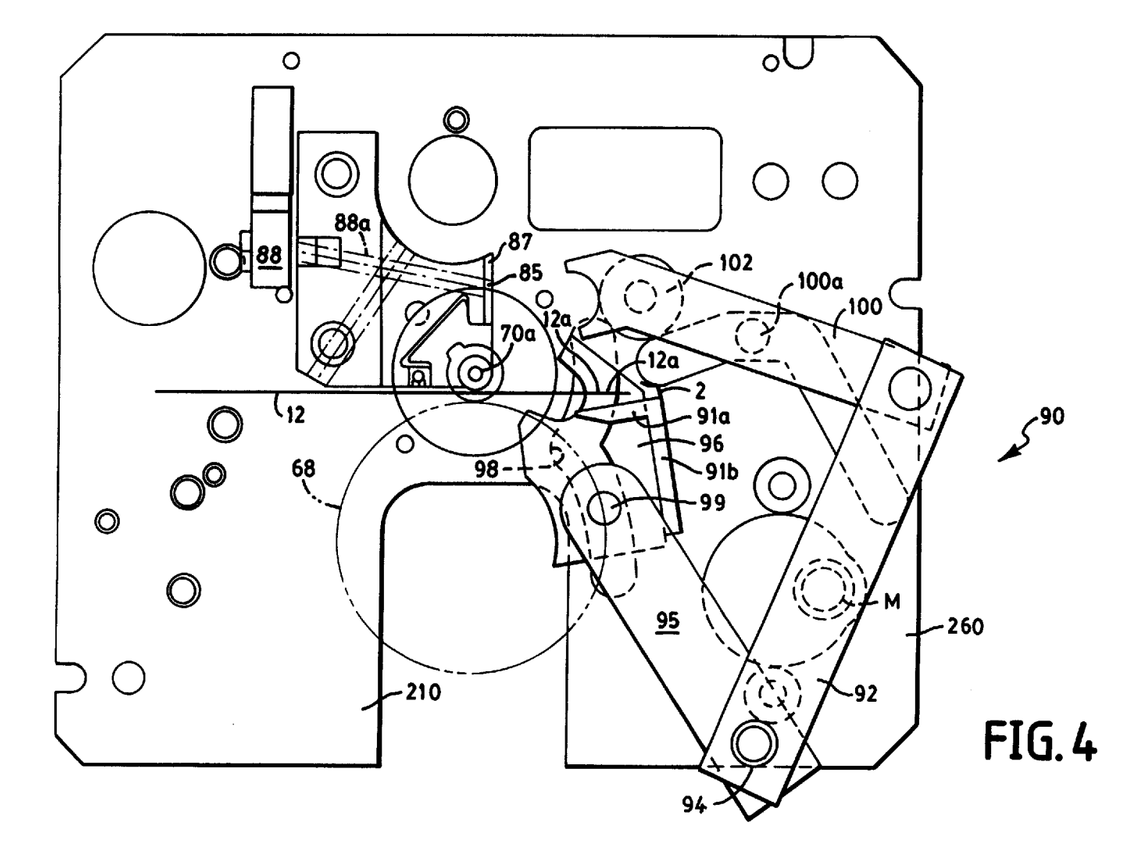
FIGS. 4 through 10 inclusive are views generally similar to FIG. 3 with parts removed and respectively showing sequential positions of parts during a cycle of operation.

When the leading edge 12a of the laminate 12 enters the nip between peel surface 70a and the lower peel roll 68, these elements are in a separated position for receipt of the leading edge portion of the laminate. For this purpose one of the peel rolls is made to be moved towards and away from the other. After the leading edge 12a of the laminate is fed through the nip of upper roll 70 and lower peel roll 68, the feeding is interrupted and then the nip is reduced by moving lower peel roll 68 towards the upper peel roll 70 so that the leading edge portion is engaged by the rolls at a location behind the leading edge 12a of the laminate. The laminate 12 is then fed through the nip a distance illustrated by the position of leading edge portions 12a on the downstream side of the peel rolls as shown in FIG. 4.

After the leading edge 12a of the laminate is engaged between the peel rolls 68 and 70, the leading edge portion is subjected to bending about the upper peel roll 70. This will cause some separation between the throw-away 16 and keeper layers 14. In the specific embodiment shown, the leading edge portion 12a of the laminate is bent upwardly about the peel roll 70 by a bending or folding mechanism 90 located downstream of the peel rolls and including a bending bar 91 engageable with the leading edge portion of the laminate to bend it upwardly about the peel roll 70a. After the leading edge portion of the laminate has been bent upwardly about the peel roll surface 70a, the upper layer which is the throw-away layer, is held preferably by a vacuum device generally designated 84 and including vacuum cups 85. The bending bar 91 is then lowered and as it begins to move away from the laminate a deflecting element 2, preferably a flexible resilient element, engages and moves across the leading edge 12a of the laminate to deflect the same to separate the keeper and throw-away layers due to the different stiffness of these layers. As the bending bar continues to descend and move away from the keeper, the latter will also descend under its own resiliency, towards the path of travel. The upper or throw-away layer is then released by the vacuum device 84 and peeled by any suitable means, such as a pair of cooperating eject rolls 86 from the remainder of the laminate as the latter is transported along the path by the lower peel roll 68.

Figure 7:
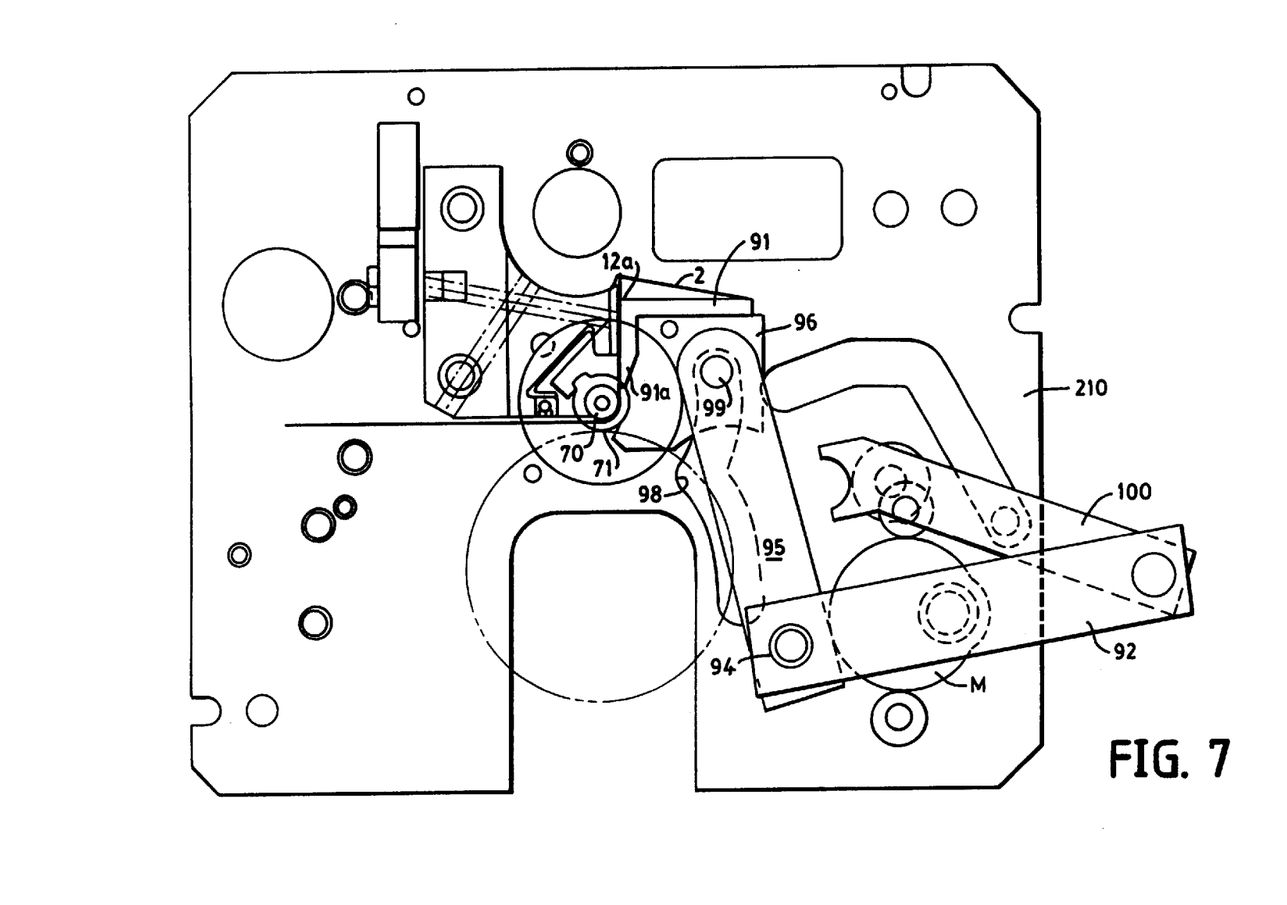
Figure 11:
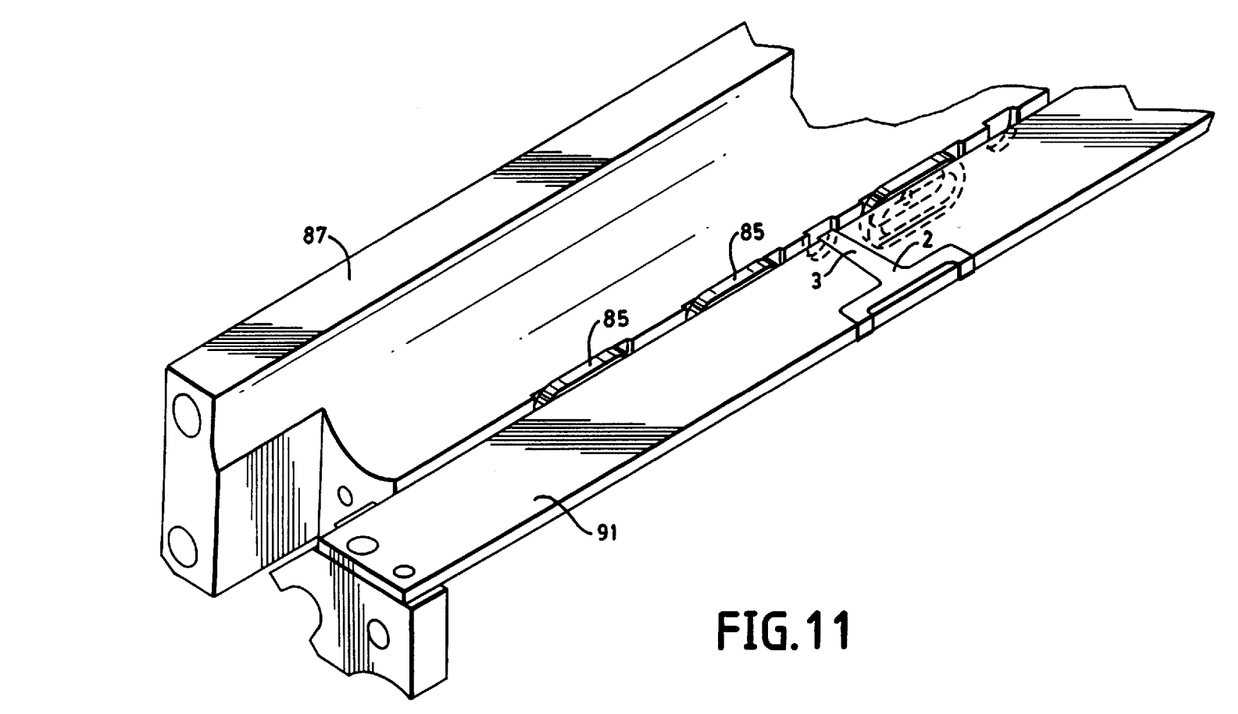
FIG. 11 is a perspective view of a deflector element included in the apparatus which is mounted on a bending bar.
Figure 11A:
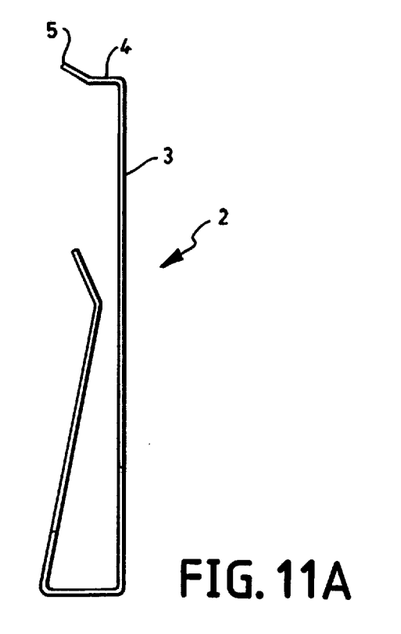
FIG. 11A is a side elevational view of the deflector element.
Figure 11B:
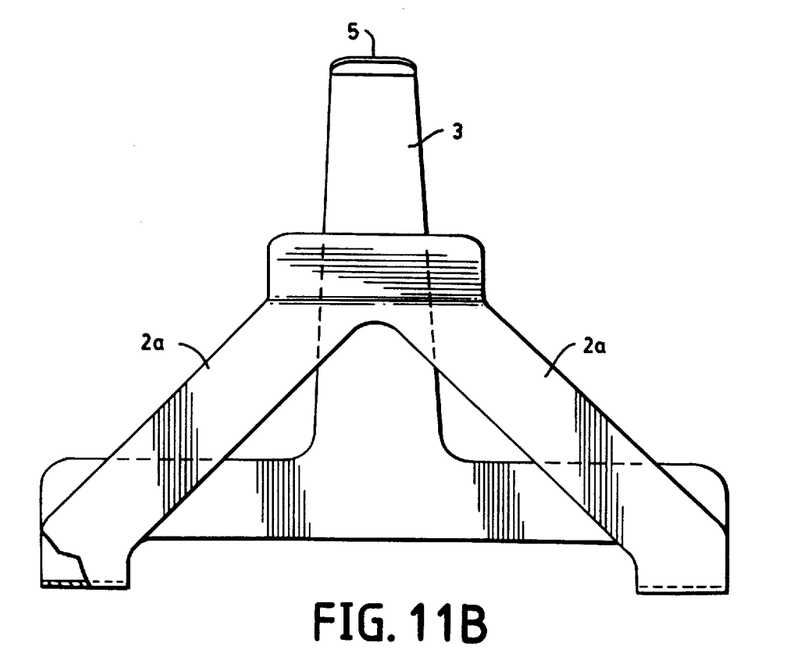
FIG. 11B is a bottom view of the deflector element.

In one embodiment shown in FIGS. 11–11B, one of a plurality of the deflecting elements 2 is shown attached to the bending bar 91 to move with the latter and has a generally inverted "L" shape operative part including a planar body portion 3 fixed to bending bar 91 and a hook portion 4 including an outwardly flared extremity 5 that extends over and beyond the bar so as to receive the leading edge 12a of the laminate as shown in FIG. 3 when the bending bar 91 is in its uppermost position (FIG. 7). The deflecting element 2 may be made from any suitable spring or spring-like material such as, for example, beryllium copper. In one form, the body portion 3 has a spring rate less that the hook portion 4. For example, the spring rate of the body portion 3 ranges from about 1.86 to 2.33 grams/mm and the spring rate of hook 4 ranges from about 0.105 to 0.130 lbs./in. The flared extremity 5 of the spring is intended to compensate for various orientations of the leading edge of the laminate when it is bent upwardly to lie against the vacuum cups.

Figures 11C, 11D:
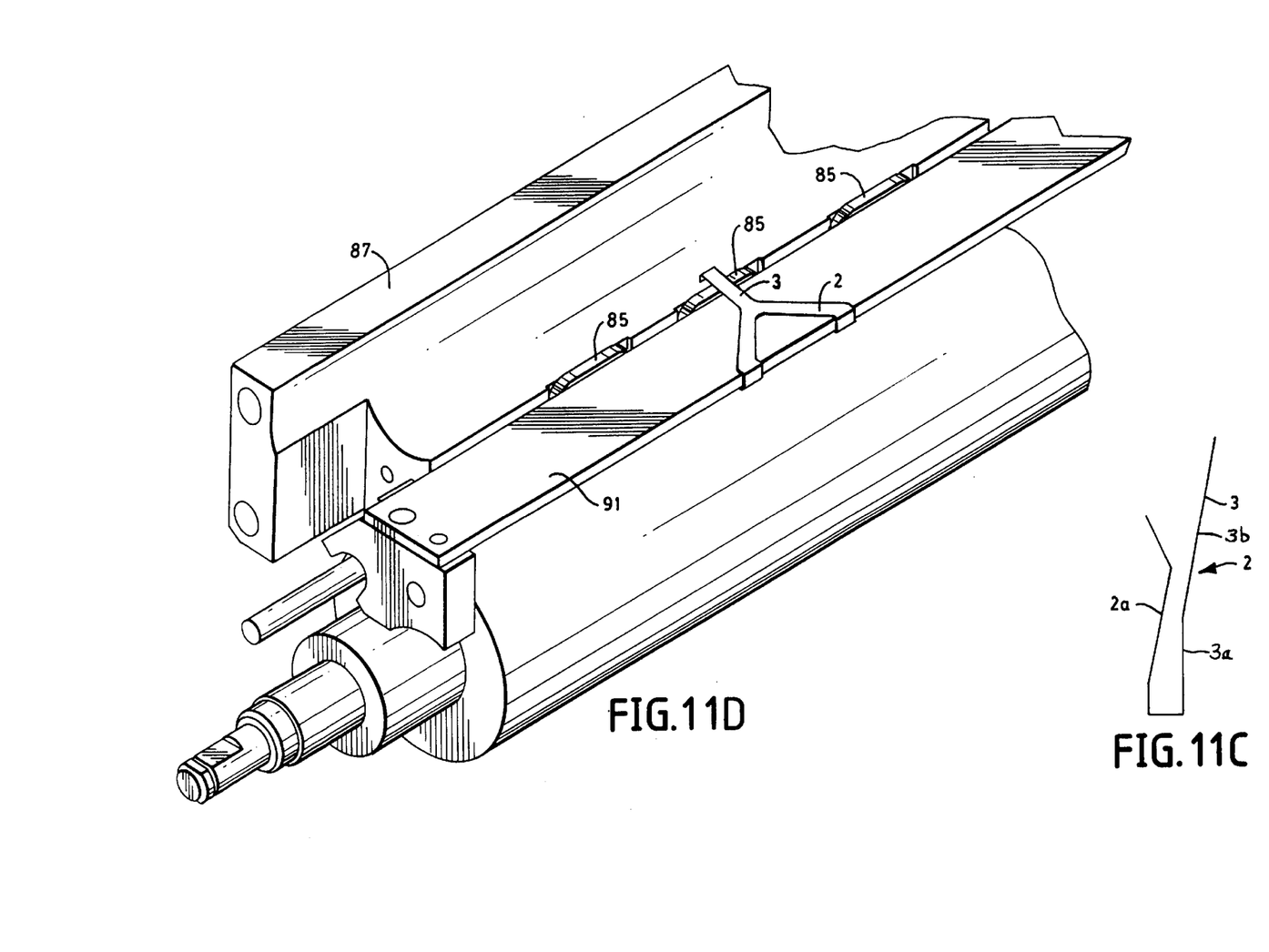
FIG. 11C is a perspective view of another embodiment of a deflector element which is mounted on a bending bar.
FIG. 11D is a side elevational view of the embodiment shown in FIG. 11C.

Referring to FIG. 11–11B, deflecting element 2 may have bifurcated portions 2a bent to define a recess for receiving a portion of the bending bar 91. The apex of the bifurcated portions 2a may engage a pin (not shown) on the bottom of the bar so as to retain the deflecting elements. Also, the deflecting member 2 can be affixed as by screws to the bending bar, or the deflecting member may have a tab thereon for insertion into an opening in the bending bar. Other shapes of the deflecting element 2 may also be employed to insure that it will deflect the leading edge portion of the laminate when the bending bar is moved away from the laminate. In this regard, reference is made to FIGS. 11C and 11D which illustrate the deflecting element having a bifurcated body portion 3a which converge toward a central portion 3b. In this embodiment, the central portion 3b is bent at an angle relative to the bar 91 for enhancing the ability of the deflector to separate the keeper sheet from the throwaway sheet upon the bar descending as described below.

Figure 12:
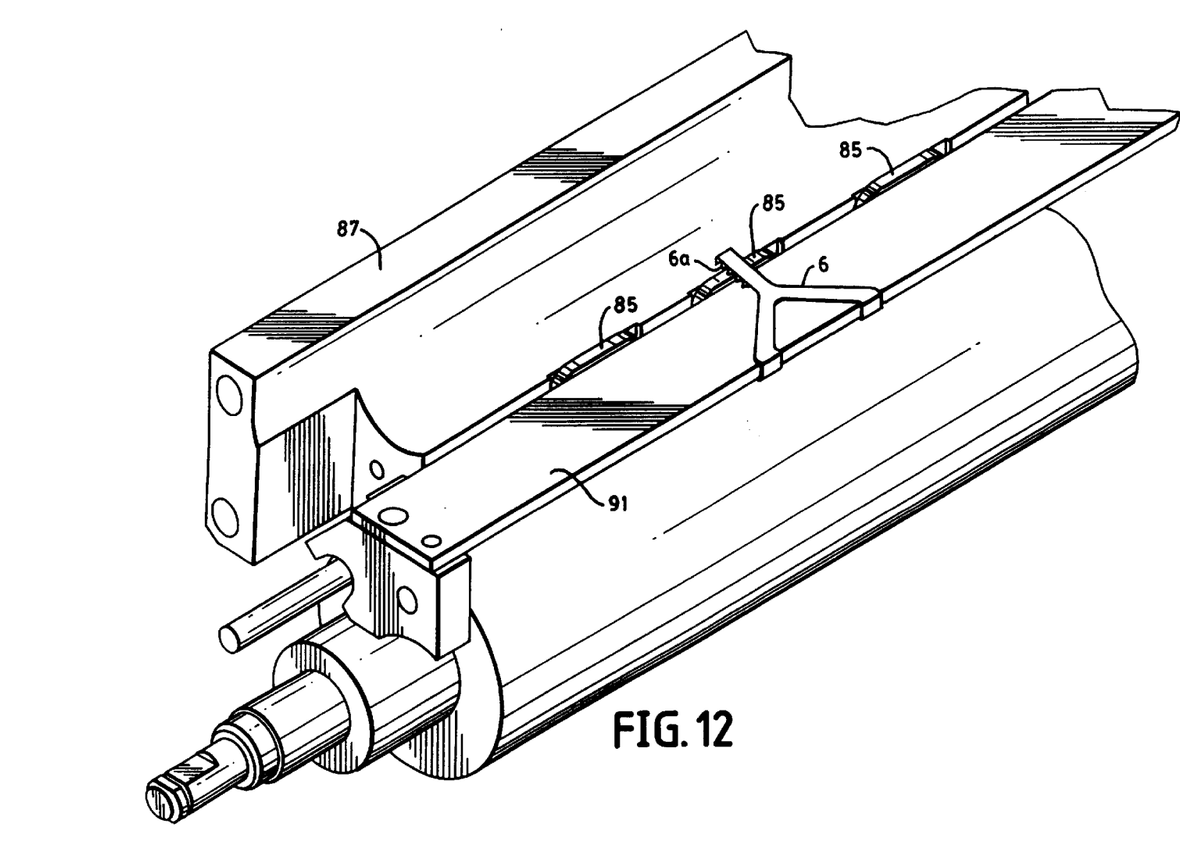
FIG. 12 is a perspective view of another deflector element that may be used instead of that disclosed in FIG. 11.

For example, the deflecting element shown at 6 in FIG. 12 may be oriented to extend across the leading edge of the laminate and present a series of comb-like fingers or serrations 6a so that the leading edge will be repeatedly engaged by the fingers to insure separation of the layers. The fingers 6a can be formed integrally with the hook portion or they can be a separate element attached to the hook. Whatever construction is utilized, however, it should be able to effect the application of repeated forces to a laminate edge. While comb-like fingers are depicted, the present invention encompasses other approaches for applying repeated forces to these edges in order to achieve the separation of the laminate.

Figure 13:
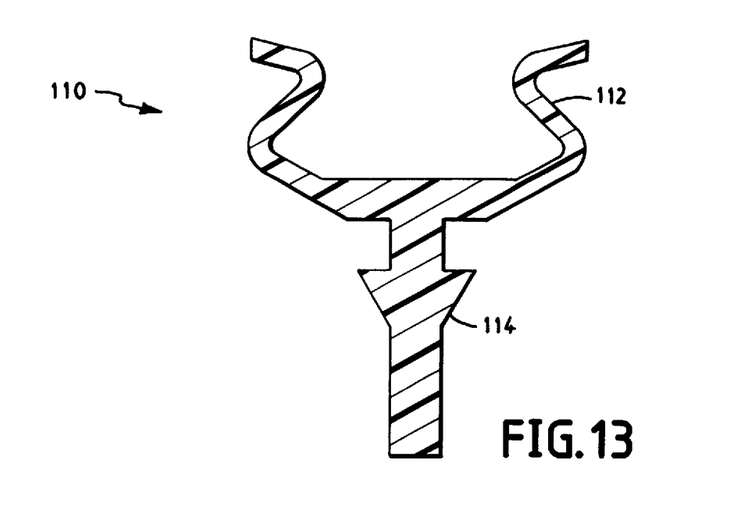
FIG. 13 is a cross-sectional view of a passive suction cup which can be attached to a bending bar.
Figure 14:
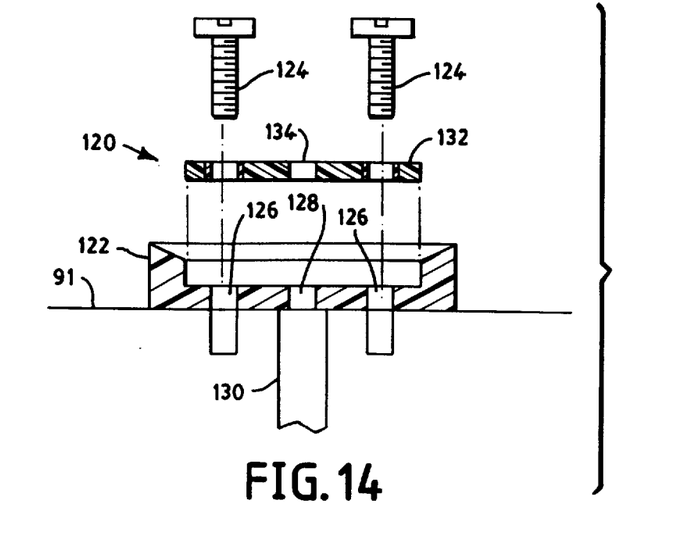
FIG. 14 is a longitudinal view of an alternate embodiment vacuum cup assembly that is to be attached to the bending bar.

In the specific embodiment shown, the vacuum-holding device includes a plurality of linearly spaced apart bellows-type vacuum cups 85 mounted to a manifold plate assembly 87 spaced transversely above the path of travel and above the peel roll 70 as shown in FIGS. 4 and 11. Vacuum is supplied from a source (not shown) connected to the cups 85 through a manifold plate assembly 88 and vacuum passages 88a. In the specific embodiment described, a plurality of deflecting elements 2, only one of which is illustrated, are provided to be located and act between the vacuum cups 85 when the bending bar 91 is in the uppermost position. In addition, the deflecting elements can be positioned so as to be aligned (not shown) with the vacuum cups. Reference is made to FIGS. 13 and 14 for illustrating a system whereby vacuum cups may also be placed on the bending bar 91 to assist separation of the keeper layer 18 in addition to or in lieu of the deflecting elements 2. FIG. 13 represents one of a plurality of passive suction cups 110 which will be mounted on the bending bar 91 in linearly spaced apart relationship. The suction cups 110 have a collapsible bellows type suction position 112 for engaging the leading edge of the laminate. A stem 114 is adapted to be held by the folding bar thereby presenting a longitudinal axis of the bellows portion 112 in a generally perpendicular relationship to the layer. The bellows portion 112 will collapse when the leading edge of the laminate is pressed against the suction cups as when the bending bar 91 is in its uppermost position. Return of the bending bar 91 to its inoperative position will create a suction force pulling on the keeper layer causing separation of the latter from the throw-away layer 16 by deflection. Clearly, the suction forces created on the keeper will be less than provided by the vacuum cups 85. Of course, the suction cups 110 are displaced relative to the vacuum cups 85 to avoid formation of suction on both sides of the laminate which would prevent separation. FIG. 14 depicts an active vacuum cup system 120 which utilizes a plurality of linearly spaced vacuum cups 122 transversely oriented along the transverse extent of the holding bar and coupled thereto as by threaded members 124.

The vacuum cups 122 each have an elongated configuration, as shown, and are made, preferably, of a resilient member, such as silicone rubber. A recessed area is provided with a pair of spaced lateral openings 126 for accommodating the threaded members. A central opening 128 provides a suction orifice which communicates a manifold 130 tubing on the bending bar 91.

There is provided a resilient plug 132 for insertion in the recess. The plug 132 has appropriate openings with a central opening 134 for cooperating with the manifold orifice 130. Each vacuum manifold 130 is connected to an appropriate source of vacuum (not shown). The vacuum force applied to the keeper sheet by the vacuum cups 122 is of less value than applied by the suction cups 85, thereby permitting separation of the keeper and throwaway layers. In this embodiment vacuum is applied to the cups through an opening in the washer.

Figure 10:
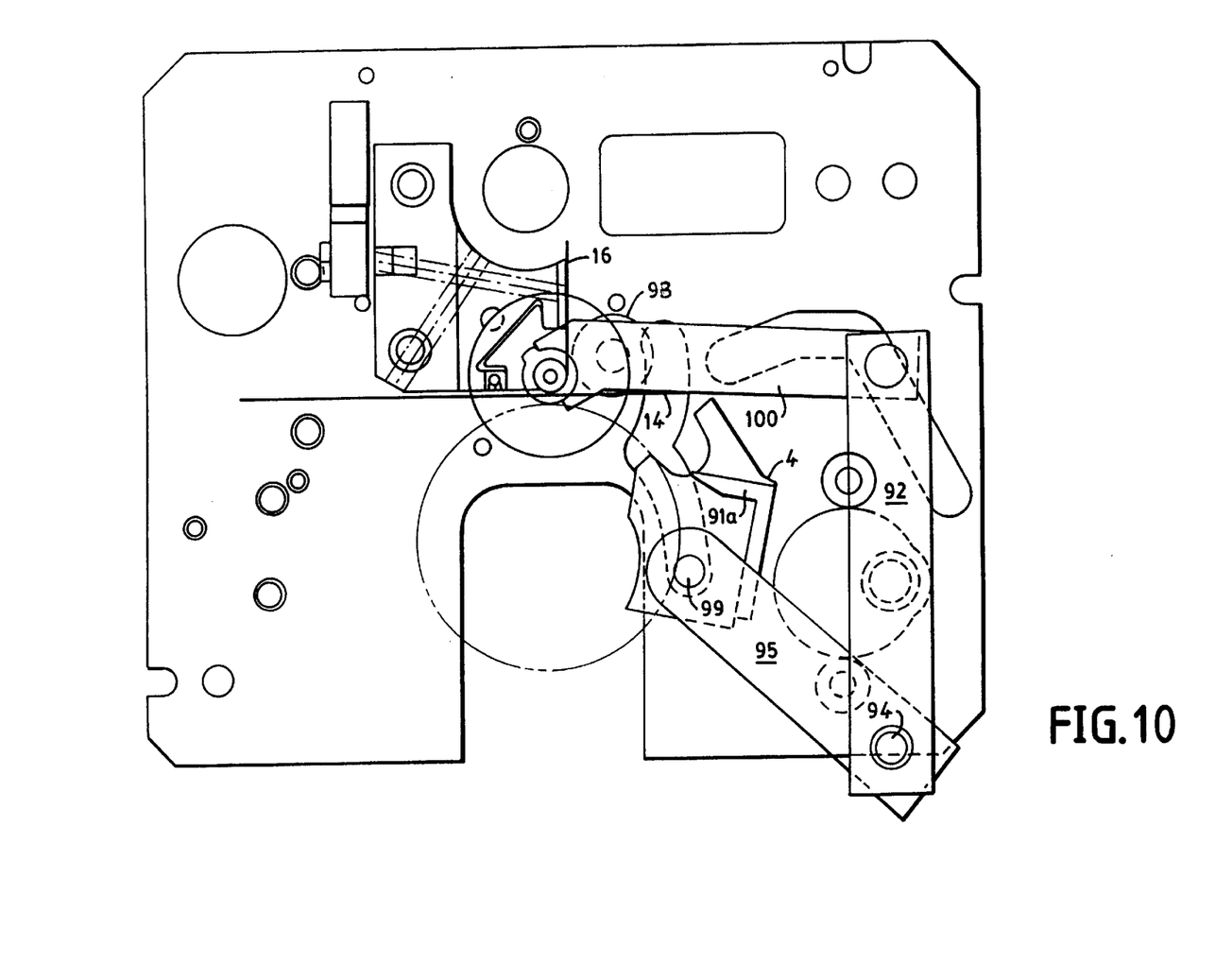

Referring back to the eject rolls 86, they are driven by any suitable means so that upon receiving the separated leading edge portion of throw-away layer 16 of the laminate they will pull the layer under a constant tension from the remainder of the laminate while the throw-away layer moves about the peel roll 70, and the remainder of the laminate is fed along the path under the drive of the lower peel roll 68 which moves at a constant speed. In the preferred embodiment, the remainder of the laminate from which the upper layer has been peeled, may be guided by any suitable means such as a deflector roll 93 such as shown in FIG. 10, towards a laminating station where the keeper surface is relaminated to provide it with a protective layer.

Figure 5:
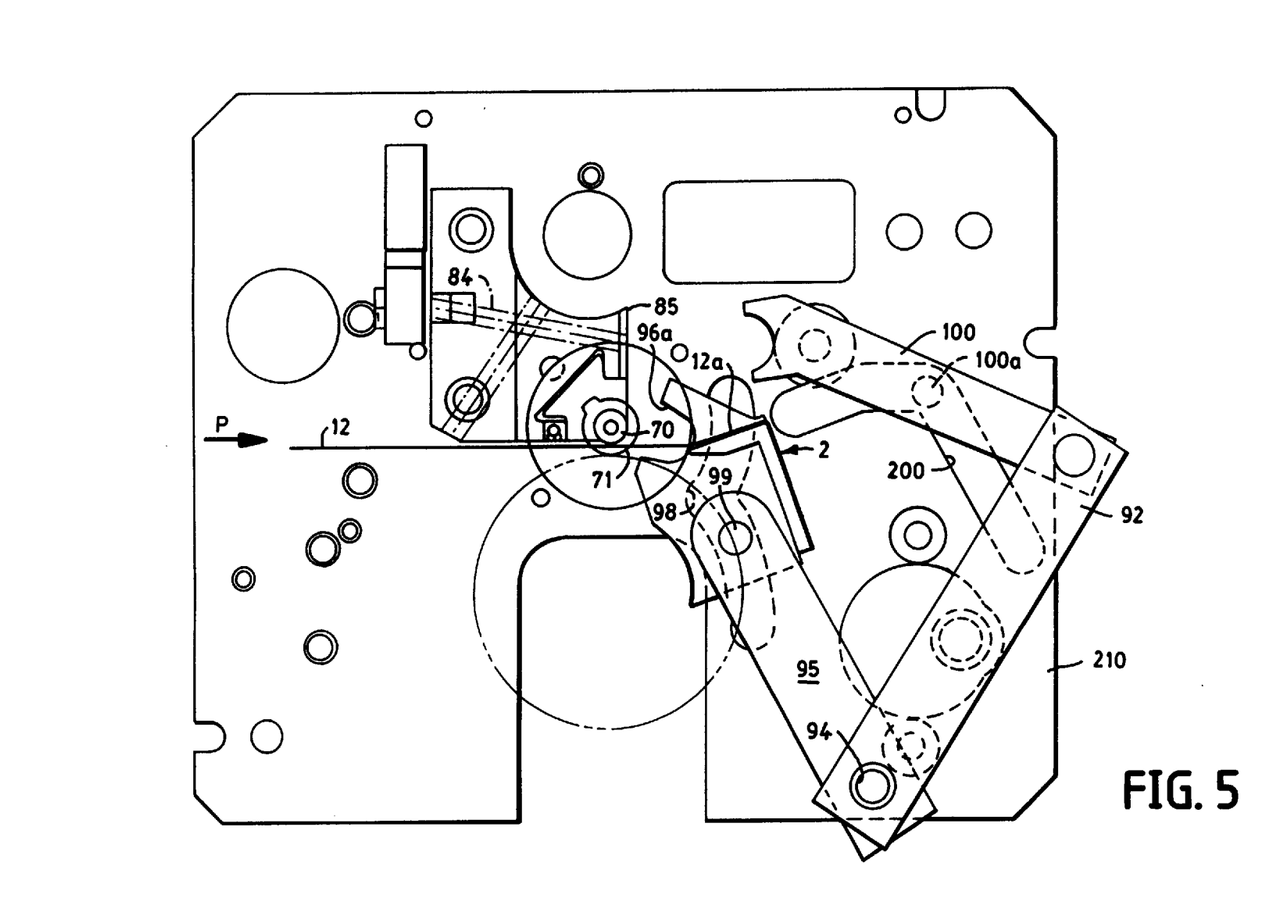
Figure 6:
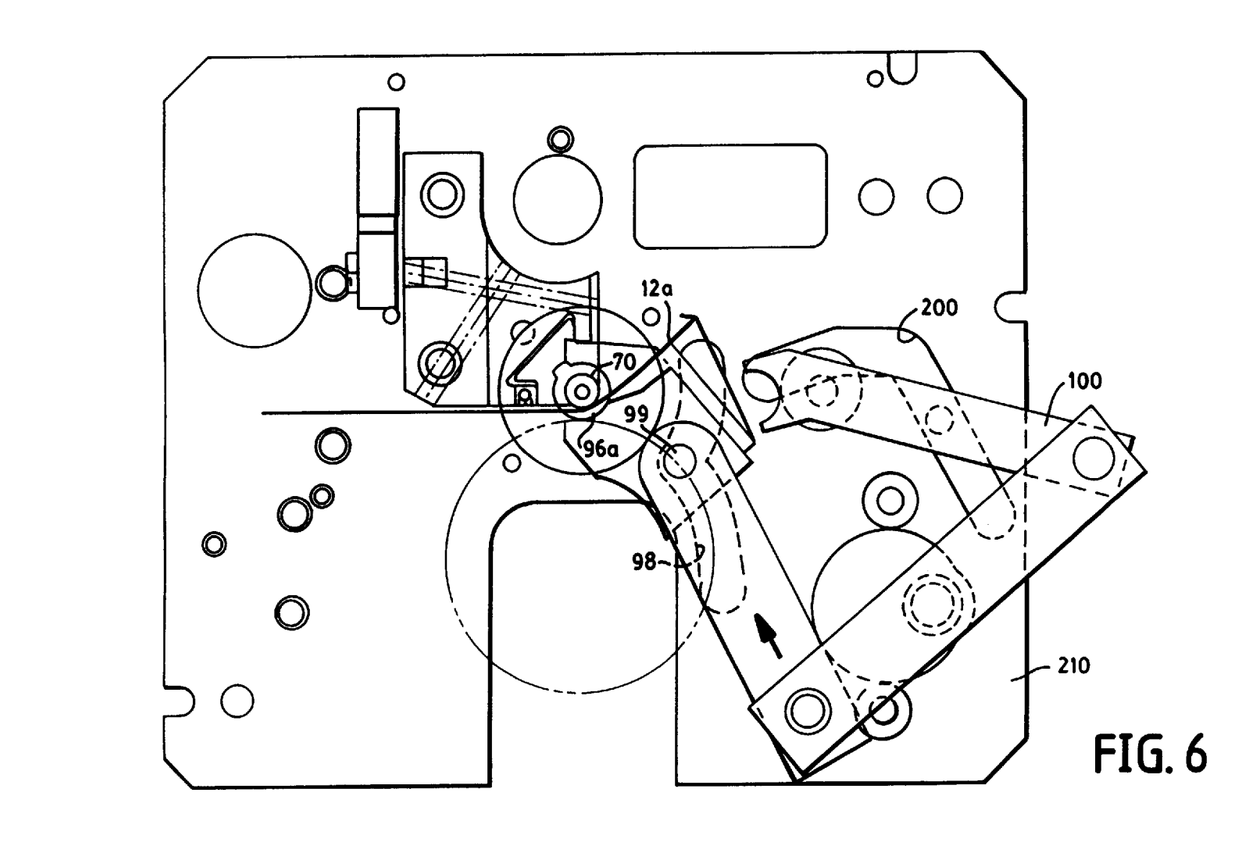

In the preferred embodiment of the apparatus of the present invention, the bending bar 91 has a generally inverted "L" shape including legs 91a and 91b as shown in FIG. 4 Leg 91a has a planar surface to engage the leading edge 12a of the laminate as shown in FIGS. 5–7. Additionally it is preferred that a bending mechanism 90 be employed to raise and lower the bending bar 91 into and out of engagement with the leading edge portion of the laminate. Referring to FIG. 4, the linkage mechanism includes a link 95 pivotally connected at one end to a crank 92 by a pivot assembly 94 and at the opposite end to a folder link 96. Link 95 is guided in its movement by slot 98 which receives a pin 99 on the link 95. Link 96 carries the bending bar 91 and is pivotable between the positions shown in FIGS. 7 and 10. The linkage mechanism or assembly 90 is operated by a motor designated M in FIG. 4 connected to the crank 92.

The link 96 has a curved surface 96a which is adapted to engage a cylindrical extension 71 of the peel rod so as to guide the bending bar 91 and thus fold the leading edge 12a of the laminate. In this regard, FIGS. 4–7 illustrate movement of the linkage assembly 90 in response to rotation of the crank 92 by the motor M. After the leading edge has been folded to the desired folded position (see FIG. 7) the motor is reversed to drive the linkage assembly to its original pre-folded and at rest position.

For a more detailed description of another linkage mechanism as well as a vacuum device and slip surface 70 that may also be employed, reference may be had to the related patent application identified above.

Figure 8:
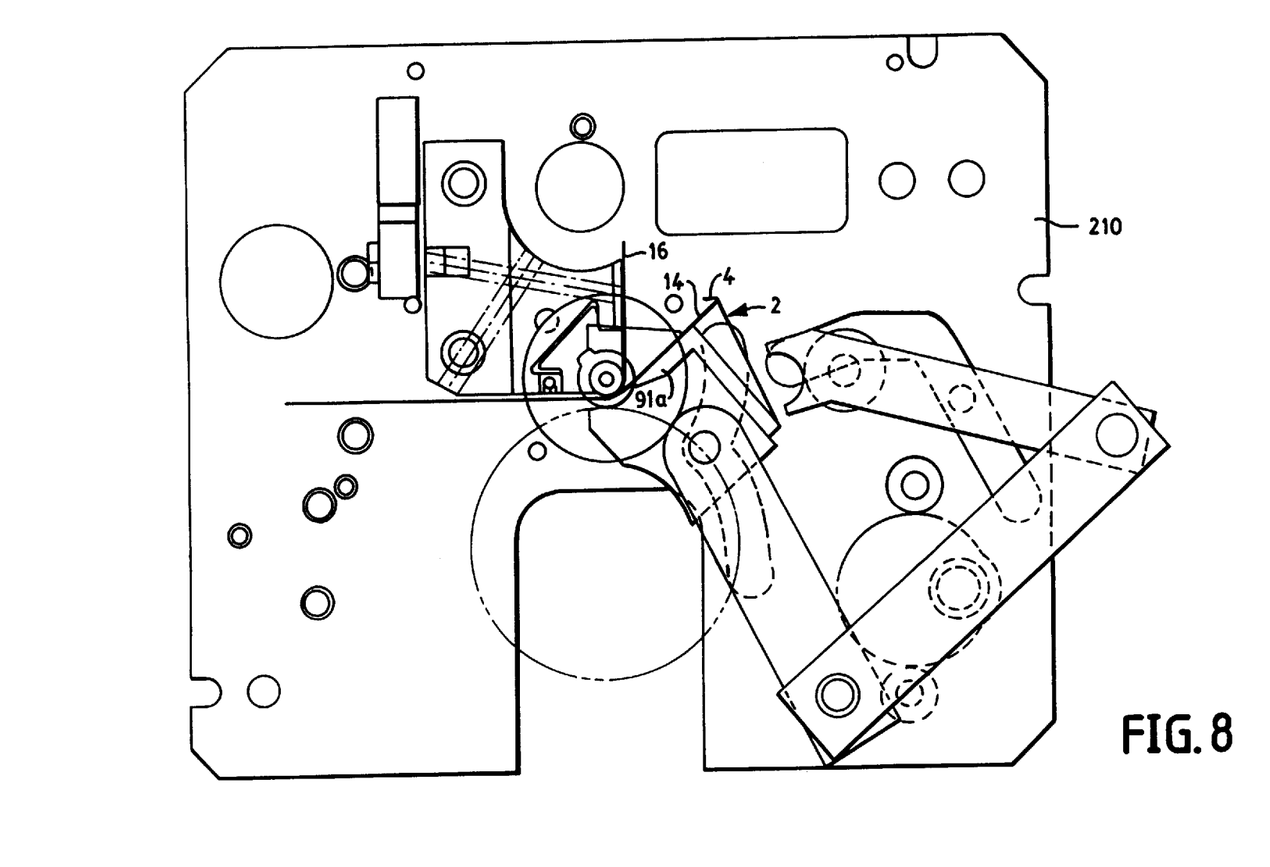
Figure 9:
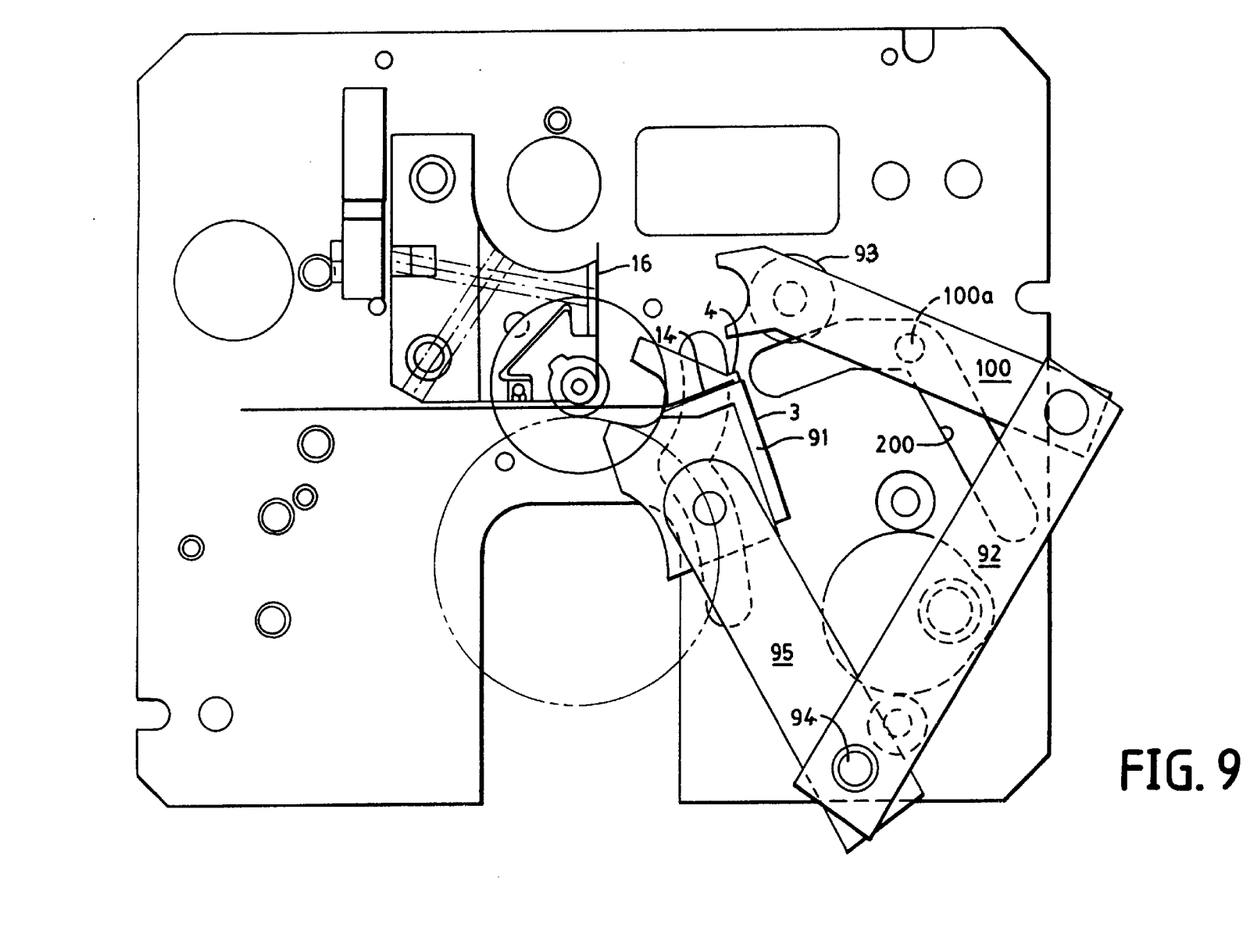

In operation, after the leading edge portion 12a is in the position shown in FIG. 4, the linkage 92, 95 is actuated by motor M to raise the bending bar 91 into engagement with the leading edge portion as shown in FIG. 5. Continued actuation of the linkage continues to raise the bending bar 91 and bend the laminate about peel roll 70 as the bending bar 91 also pivots counterclockwise as shown in the drawings (FIG. 6). The uppermost portion of the linkage serves to bend the laminate against the vacuum cups 85 as shown in FIG. 7 whereupon vacuum is applied to the throw-away layer 16. Note also that in this position the hook portion 4 of the deflecting element 2 will be engaged over the leading edge 12a as shown in FIGS. 3 and 4. Subsequently the linkage mechanism is actuated to lower the bending bar 91 and during the initial lowering movement the hook portion 4 will deflect both the keeper layer 18 and the throw-away layer 16 to cause them to separate from each other due to the fact that the throw-away is still held by the vacuum cups at a point spaced from the edge of the laminate and the layers have different stiffness. As the bending bar 91 continues to descend as shown in FIGS. 8 and 9, the keeper layer 18 will also descend under its own resiliency and also with the aid of the deflecting element 2. The lowermost position of the keeper layer 14 and the linkage mechanism 90 is shown in FIG. 10. In this position of the linkage mechanism, a guide roll 90 mounted to a link 100 connected to the crank 92, is lowered to guide the keeper layer 18 along its path towards the relamination station (not shown). The throw-away layer 16 is peeled by eject rolls 86 under the guidance of the peel roll 70 as the keeper continues along the path towards the delamination station. Link 100 is constrained by means of pin 100a fixed to link 100 and received in slot 200 as shown in FIG. 9. The basic support for all of the elements of the apparatus is provided by opposite vertical support plates 210, one being shown in FIG. 4.

Although several specific and preferred methods and apparatus of the present invention have been shown and described above, other variations of the present invention will become apparent to those skilled in the art. The scope of the invention is therefore not limited to the specific forms shown and described but rather is indicated by the claims below.

What is claimed is:

1. A method of separating layers in a laminate comprising the steps of: bending the laminate about a member, holding the laminate while it is bent about said member, and then deflecting a free edge portion of the laminate while the laminate is bent about said member to separate layers in the laminate; including the steps of engaging the laminate on one side thereof and moving it about the member to bend the laminate, holding said other side of the laminate while the laminate is deflected and releasing the laminate on said one side thereof to permit the layers to separate.

2. The method defined in claim 1 including the step of holding the laminate at a location spaced from the free edge portion.

3. The method defined in claim 1 including the step of holding the laminate by applying a vacuum to a surface thereof.

4. The method defined in claim 1 wherein prior to bending about said member the laminate is moved through a nip defined by said member and a roll spaced from the member.

5. The method defined in claim 4 applied to a laminate including imaging-media and a keeper layer and a throw-away layer, and wherein said throw-away layer is held while the keeper layer is separated therefrom upon deflection.

6. The method defined in claim 1 applied to a laminate whose layers have different stiffness such that their deflection causes the layers to separate.

7. Apparatus for separating layers in a laminate comprising in combination: a member about which a laminate is to be bent, first means for moving the laminate to bend it about said member, second means for holding the laminate while bent about said member, and third means for engaging a free edge portion on the laminate while it is bent about said member for separating layers of the laminate; said third means is connected to said first means and includes a spring element engageable across the free edge portion of the laminate to deflect the same; wherein said first means is movable in a first upward direction to engage the laminate and bend it about said member and is movable in a downward direction to release the laminate to allow one of the separated layers to move downwardly and wherein said spring element engages across the free edge portion of the laminate as the first means begins its downward movement.

8. Apparatus defined in claim 7 wherein said second means includes a vacuum device.

9. Apparatus defined in claim 8 including a nip defined by said member and an underlying roll for receiving the laminate in the nip prior to bending about said member.

10. Apparatus defined in claim 7 including a nip defined by said member and an underlying roll for receiving the laminate in the nip prior to bending about said member.

11. Apparatus defined in claim 7 wherein said second means engages the laminate at a location spaced from the free edge portion, and said third means deflects said free edge portion while it is held by said second means.

12. Apparatus defined in claim 11 wherein said first means engages one side of a laminate, and said second means engages the opposite side of the laminate.

13. Apparatus defined in claim 12 wherein said first means is movable in an upward direction to engage the laminate and bend it about said member and is movable in a downward direction to release the laminate to allow one of the separated layers to move downwardly.

14. Apparatus defined in claim 13 wherein said third means is connected to said first means to move with said first means.

15. Apparatus defined in claim 14 wherein said third means is a flexible and resilient element movable across the free edge portion as the first means moves downwardly away from the laminate.

16. Apparatus defined in claim 13 wherein said second means applies a vacuum to said opposite side of the laminate.

17. Apparatus defined in claim 13 wherein said first means includes an elongated bar engageable transversely across the laminate when in an uppermost position, and a linkage means mounting the bar for movement between upper and lower positions.

18. Apparatus defined in claim 7 wherein said spring element includes a hook portion at its extremity for engaging the edge of a laminate.

19. Apparatus defined in claim 18 wherein said hook portion includes a flared portion.

20. Apparatus defined in claim 7 wherein said first means includes a planar surface engageable with the surface of a laminate.

21. Apparatus defined in claim 7 wherein said first means includes a part engageable with the laminate and a linkage means for moving said part between upper and lower positions.

22. Apparatus defined in claim 7 wherein said member has a peel surface about which the laminate is bent by said first means.

23. Apparatus defined in claim 22 including means for driving the laminate under said peel surface, and means for driving the layer of the laminate once the layer is separated from the laminate to peel said layer from the laminate and about said peel surface.

24. Apparatus defined in claim 7 wherein said third means includes vacuum applying means for engaging one side of the laminate and applying a force thereto which is less than holding forces applied by said second means, such that as said first means is movable in a direction away from said second means, the laminate separates.

25. Apparatus defined in claim 24 wherein said second means includes vacuum applying means for applying a vacuum to the other side of the laminate.

26. Apparatus defined in claim 24 wherein said vacuum applying means includes a passive suction cup being attached to said first means.

27. Apparatus defined in claim 24 wherein said vacuum applying means includes a vacuum cup assembly which engages the one side of the laminate.

28. Apparatus defined in claim 24 wherein said first means is movable in a first upward direction to engage the laminate and bend it about said member and is movable in a downward direction to release the laminate to allow one of the separated layers to move downwardly and wherein said vacuum applying means engages a portion of the one side of the free edge portion of the laminate as said first means moves downwardly.

29. A method of separating layers in a laminate comprising the steps of: bending the laminate about a member, holding the laminate while it is bent about said member, and then deflecting a free edge portion of the laminate while the laminate is bent about said member to separate layers in the laminate, and including the step of deflecting the free edge portion of the laminate by engaging the free edge portion with a deflecting element.

30. A method of separating layers in a laminate comprising the steps of: bending the laminate about a member, holding the laminate while it is bent about said member, and then deflecting a free edge portion of the laminate while the laminate is bent about said member to separate layers in the laminate, including the steps of engaging the laminate on one side thereof and moving it about the member to bend the laminate, holding said other side of the laminate while the laminate is deflected and releasing the laminate on said one side thereof to permit the layers to separate and including the steps of: moving the laminate upwardly by engaging said one side with an upwardly moving bending element, deflecting the free edge portion of the laminate with a deflecting element attached to the bending element and while the bending element is lowered to release said one side of the laminate.

31. The method defined in claim 30 including the step of using a resilient flexible element as the deflecting element.

32. The method defined in claim 30 including the step of deflecting the free edge portion of the laminate by applying a vacuum to said one side with a force less than the holding force.

33. The method defined in claim 32 including the step of holding the one side of the laminate by applying a vacuum to a surface thereof.

34. The method defined in claim 33 wherein said step of applying a vacuum is performed actively.

35. The method defined in claim 33 wherein said step of applying a vacuum is performed passively by using a suction cup which engages the one side of the laminate.

* * * * *